United States Patent
Chen et al.

(10) Patent No.: US 6,825,085 B2
(45) Date of Patent: Nov. 30, 2004

(54) METHOD TO IMPROVE FLASH FORWARD TUNNELING VOLTAGE (FTV) PERFORMANCE

(75) Inventors: Shih-Ming Chen, Hsinchu (TW); Kuo-Chiang Ting, Yunlin (TW); Jen-Shiang Leu, Hsinchu (TW)

(73) Assignee: Taiwan Semiconductor Manufacturing Company, Limited, Hsin-Chu (TW)

( * ) Notice: Subject to any disclaimer, the term of this patent is extended or adjusted under 35 U.S.C. 154(b) by 41 days.

(21) Appl. No.: 10/290,644

(22) Filed: Nov. 8, 2002

(65) Prior Publication Data

US 2004/0092077 A1 May 13, 2004

(51) Int. Cl.⁷ .......................................... H01L 21/8247
(52) U.S. Cl. ........................................................ 438/266
(58) Field of Search ................................. 438/266, 594, 438/257, 264

(56) References Cited

U.S. PATENT DOCUMENTS

| | | | | |
|---|---|---|---|---|
| 6,200,859 B1 | * | 3/2001 | Huang et al. | 438/264 |
| 6,368,976 B1 | * | 4/2002 | Yamada | 438/713 |
| 6,462,370 B2 | * | 10/2002 | Kuwazawa | 257/296 |
| 6,528,844 B1 | * | 3/2003 | Hopper et al. | 257/316 |
| 6,627,500 B1 | * | 9/2003 | Liu et al. | 438/261 |

\* cited by examiner

*Primary Examiner*—David Nelms
*Assistant Examiner*—Quoc Hoang

(57) ABSTRACT

A floating gate structure and a method for forming a floating gate oxide layer comprising the following steps. A structure having a first dielectric layer formed thereover is provided. An oxide layer is formed over the first dielectric layer. A nitride layer is formed over the oxide layer. The nitride layer is patterned to form an opening exposing a portion of the oxide layer. A portion of the first dielectric layer is exposed by removing: the exposed portion of the oxide layer; and portions of the oxide layer underneath the patterned nitride layer adjacent to the opening to form respective undercuts. The exposed portion of the first dielectric layer is oxidized to form the floating gate oxide layer.

57 Claims, 2 Drawing Sheets

METHOD TO IMPROVE FLASH FORWARD TUNNELING VOLTAGE (FTV) PERFORMANCE

FIELD OF THE INVENTION

The present invention relates generally to semiconductor fabrication and more specifically to formation of flash memory floating gate oxide.

BACKGROUND OF THE INVENTION

The most important electrical parameter of Flash memory is Forward Tunneling Voltage (FTV). FTV is a measurement of the ease of erasing the cell by removing the charge from F6→CG. The trap-up rate, i.e. electron ($e^-$) trapping in oxide, is also an important electrical parameter.

U.S. Pat. No. 6,031,264 B1 to Chien et al. describes a flash EEPROM process using polyoxide steps.

U.S. Pat. No. 5,879,993 to Chien et al. describes a flash EEPROM process.

U.S. Pat. No. 6,355,527 B1 to Lin et al. describes a flash EEPROM process.

U.S. Pat. Nos. 6,088,269 to Lambertson and 6,358,796 B1 to Lin et al. each describe related Flash processes.

SUMMARY OF THE INVENTION

Accordingly, it is an object of one or more embodiments of the present invention to provide a method of forming tip-corner-shaped floating gate oxide.

Other objects will appear hereinafter.

It has now been discovered that the above and other objects of the present invention may be accomplished in the following manner. Specifically, a structure having a first dielectric layer formed thereover is provided. An oxide layer is formed over the first dielectric layer. A nitride layer is formed over the oxide layer. The nitride layer is patterned to form an opening exposing a portion of the oxide layer. A portion of the first dielectric layer is exposed by removing: the exposed portion of the oxide layer; and portions of the oxide layer underneath the patterned nitride layer adjacent to the opening to form respective undercuts. The exposed portion of the first dielectric layer is oxidized to form the floating gate oxide layer. A floating gate oxide structure, comprising: (1) a structure having a dielectric layer thereover; (2) a patterned nitride layer over the dielectric layer; the patterned nitride layer including an opening therein proximate undercuts between the patterned nitride layer and the dielectric layer; (3) a floating gate oxide layer between the dielectric layer and the patterned nitride layer; the floating gate oxide layer including: opposing tip corners within the undercuts; and a central, bulge portion at least partially exposed by the patterned nitride layer opening.

BRIEF DESCRIPTION OF THE DRAWINGS

The present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENT

Known to the Inventors—Not to be Considered Prior Art

The following is known to the inventors and is not to be considered to be prior art for the purposes of this invention.

The shape of the floating gate oxide is a key factor in the Forward Tunneling Voltage (FTV) and the trap-up rate of Flash memory. The inventors have discovered that achieving a tip-shape of the floating gate oxide improves the FTV of the Flash memory.

Figure 1:
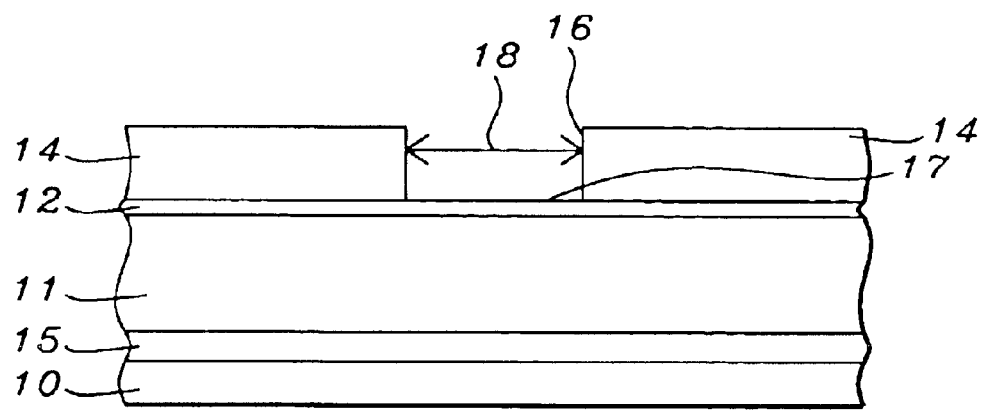
FIGS. 1 to 3 schematically illustrate a preferred embodiment of the present invention.

Initial Structure—FIG. 1

As shown in FIG. 1, a structure 10 is provided having an upper gate oxide layer 15 is formed thereover.

A polysilicon layer 11 formed over gate oxide layer 15 to a thickness of preferably from about 900 to 1100 Å, more preferably from about 950 to 1050 Å and most preferably about 1000 Å.

Structure 10 is preferably a silicon substrate or a germanium substrate, is more preferably a silicon substrate and is understood to possibly include a semiconductor wafer or substrate.

A thin silicon oxide layer 12 is then formed over polysilicon layer 11 to a thickness of preferably from about 26 to 34 Å, more preferably from about 28 to 32 Å and most preferably about 30 Å.

A nitride or silicon nitride ($Si_3N_4$ or just SiN) layer 14 is formed over the thin oxide layer 12 to a thickness of preferably from about 720 to 880 Å, more preferably from about 760 to 840 Å and most preferably about 800 Å.

SiN layer 14 is then patterned preferably using a dry etch process at the following parameters:

temperature: preferably from about 15 to 25° C. and more preferably from about 17 to 23° C.;

pressure: preferably from about 225 to 275 mTorr and more preferably from about 245 to 255 mTorr;

RF power: preferably from about 1000 to 1400 W and more preferably from about 1080 to 1320 W;

$O_2$ gas flow: preferably from about 4 to 6 sccm and more preferably from about 4.5 to 5.5 sccm;

$CF_4$ gas flow: preferably from about 66 to 76 sccm and more preferably from about 68 to 74 sccm;

Ar gas flow: preferably from about 750 to 950 sccm and more preferably from about 800 to 900 sccm; and time: preferably from about 45 to 55 seconds and more preferably from about 48 to 52 seconds.

Patterned SiN layer 14 includes an opening 16 exposing a portion 17 of thin oxide layer 12. Opening 16 has a width 18 of preferably from about 0.34 to 0.40 μm and more preferably from about 0.36 to 0.38 μm.

Figure 2:
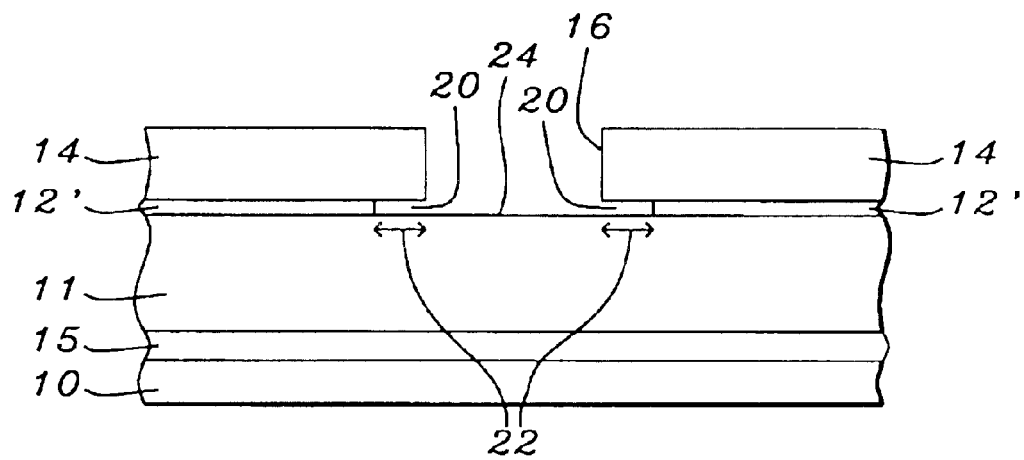

Formation of Undercut 20 in Thin Oxide Layer 12 Under Patterned SiN Layer 14—FIG. 2

As shown in FIG. 2, thin oxide layer 12 is etched to remove the exposed portion 17 of thin oxide layer 12 and to remove a portion of the thin oxide layer 12 adjacent opening 16 under patterned SiN layer 14, forming undercuts 20 and exposing a portion 24 of underlying polysilicon layer 11. Undercuts 20 extend preferably from about 30 to 70 Å under patterned SiN layer 14, more preferably from about 40 to 60 Å and most preferably about 50 Å.

Thin oxide layer 12 is preferably etched to form undercuts 20 using an oxide wet bench dip.

The oxide wet bench is conducted at the following parameters:

HF: $H_2O$ ratio: preferably from about 90:1 to 110:1, more preferably from about 95:1 to 105:1 and most preferably about 100:1;

temperature: preferably from about 18.5 to 28.5° C. and more preferably from about 20.5 to 26.5° C.;

pressure: preferably from about 740 to 780 mTorr and more preferably from about 750 to 770 mTorr; and time: preferably from about 80 to 100 seconds and more preferably from about 85 to 95 seconds.

Figure 3:
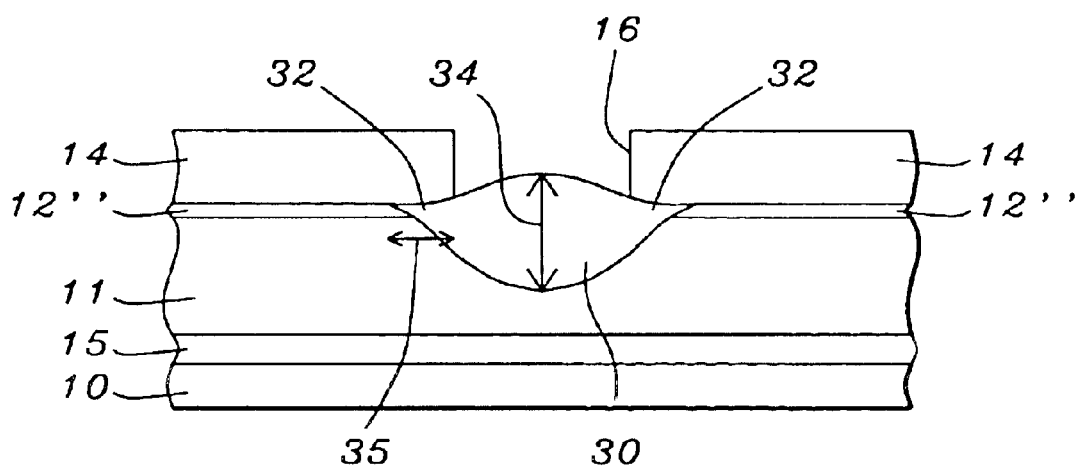

Oxidation of The Exposed Portion 24 of Polysilicon Layer 11—FIG. 3

As shown in FIG. 3, the exposed portion 24 of polysilicon layer 11 is oxidized to form floating gate oxide portion 30 having respective tip corners 32 that have a longer and sharper tip profile induced by undercuts 20 than found in conventional methods not having such undercuts 20 formed before the oxidation of polysilicon layer 11. Floating gate oxide portion 30 is essentially indistinguishable from the adjacent etched thin oxide layer 12" as shown in FIG. 3.

Floating gate oxide portion 30 has a mid-thickness 34 of preferably from about 3500 to 4500 Å and more preferably from about 3800 to 4200 Å. Tip corners 32 each have an average width 35 of preferably from about 250 to 350 Å and more preferably from about 280 to 320 Å.

Figure 4:
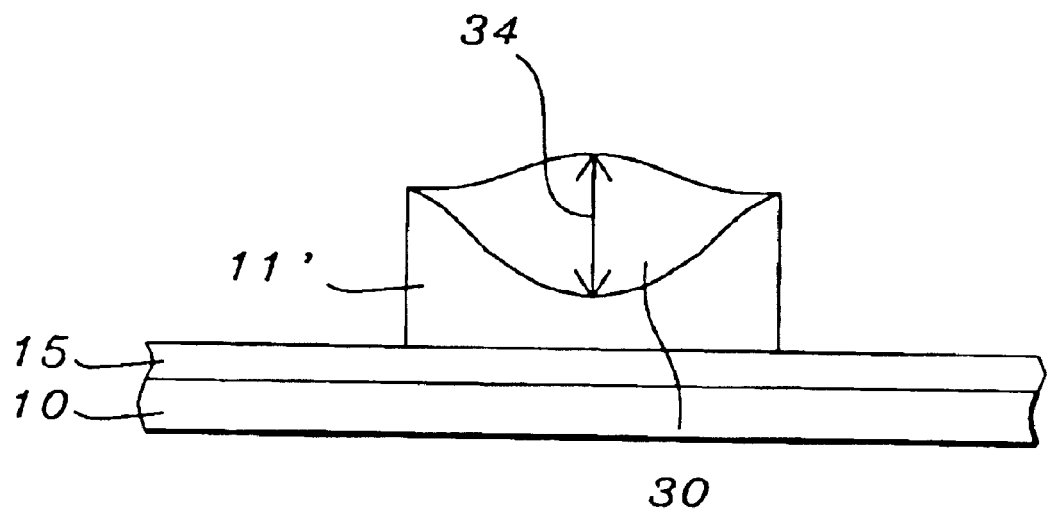
FIGS. 4 and 5 schematically illustrate further processing of the structure of FIG. 3 in forming a flash memory.
Figure 5:
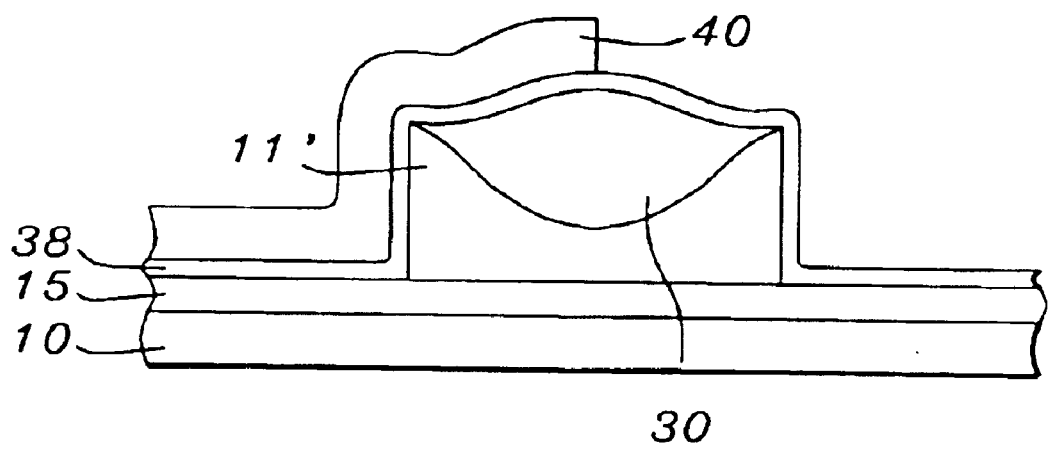

Further processing may then proceed in forming a flash memory 50 such as shown in FIG. 5 through FIG. 4 with, for example: the removal of nitride layer 14 and the remainder of etched thin oxide layer 12"; the patterning and removal of polysilicon layer 11 not under floating gate oxide portion 30 to form remaining polysilicon layer 11' and the formation of an interpoly oxide layer over the structure and formation of control gate 40.

The inventors have determined that the flash forward tunneling voltage (FTV) performance of flash memory is improved from about 7.0 to 8.0 and more preferably from about 7.4 to 7.6 when the method of the present invention is used to form the floating gate oxide layer 30 employed in the flash memory. Similarly, the FTV is decreased preferably from about 6.0 to 7.0 and more preferably from about 6.4 to 6.6 in such a flash memory.

While particular embodiments of the present invention have been illustrated and described, it is not intended to limit the invention, except as defined by the following claims.

We claim:

1. A method for forming a floating gate oxide layer, comprising the steps of:
   providing a structure having a poly layer formed thereover;
   forming an oxide layer over the poly layer;
   forming a nitride layer over the oxide layer;
   patterning the nitride layer to form an opening exposing a portion of the oxide layer;
   exposing a portion of the poly layer by removing:
      the exposed portion of the oxide layer; and
      portions of the oxide layer underneath the patterned nitride layer adjacent to the opening to form respective undercuts; and
   oxidizing the exposed portion of the poly layer to form the floating gate oxide layer.

2. The method of claim 1, wherein the floating gate oxide layer includes respective tip corners.

3. The method of claim 1, including the step of forming a flash memory incorporating the floating gate oxide layer whereby the forward tunneling voltage of the flash memory is improved.

4. The method of claim 1, wherein the nitride layer is silicon nitride.

5. The method of claim 1, wherein the structure is a silicon substrate or a germanium substrate.

6. The method of claim 1, wherein the structure is a silicon substrate.

7. The method of claim 1, wherein the oxide layer is a silicon oxide layer.

8. The method of claim 1, wherein the silicon oxide layer has a thickness of from about 26 to 34 Å; the poly layer has a thickness of from about 900 to 1100 Å; the oxide layer has a thickness of from about to 34 Å; and the nitride layer has a thickness of from about 720 to 880 Å.

9. The method of claim 1, wherein the silicon oxide layer has a thickness of from about 28 to 32 Å; the poly layer has a thickness of from about 950 to 1050 Å; the oxide layer has a thickness of from about 28 to 32 Å; and the nitride layer has a thickness of from about 760 to 840 Å.

10. The method of claim 1, wherein the silicon oxide layer has a thickness of about 30 Å; the poly layer has a thickness of about 1000 Å; the oxide layer has a thickness of about 30 Å; and the nitride layer has a thickness of about 800 Å.

11. The method of claim 1, wherein the nitride layer is patterned using a dry etch.

12. The method of claim 1, wherein the nitride layer is patterned using a dry etch process at the following conditions:
   temperature: from about 15 to 25° C.;
   pressure: from about 225 to 275 mTorr;
   RF power: from about 1000 to 1400 W;
   $O_2$ gas flow: from about 4 to 6 sccm;
   $CF_4$ gas flow: from about 66 to 76 sccm;
   Ar gas flow: from about 750 to 950 sccm; and
   time; from about 45 to 55 seconds.

13. The method of claim 1, wherein the nitride layer is patterned using a dry etch process at the following conditions:
   temperature: from about 17 to 23° C.;
   pressure: from about 245 to 255 mTorr;
   RF power: from about 1080 to 1320 W;
   $O_2$ gas flow: from about 4.5 to 5.5 sccm;
   $CF_4$ gas flow: from about 68 to 74 sccm;
   Ar gas flow: from about 800 to 900 sccm; and
   time; from about 48 to 52 seconds.

14. The method of claim 1, wherein the exposed portion of the oxide layer; and the portions of the oxide layer underneath the patterned nitride layer adjacent to the opening are removed by etching.

15. The method of claim 1, wherein the exposed portion of the oxide layer; and the portions of the oxide layer underneath the patterned nitride layer adjacent to the opening are removed by an oxide wet bench dip etching process.

16. The method of claim 1, wherein the exposed portion of the oxide layer; and the portions of the oxide layer underneath the patterned nitride layer adjacent to the opening are removed by an oxide wet bench dip process at the following conditions:
   HF: $H_2O$ ratio: from about 90:1 to 110:1;
   temperature: from about 18.5 to 28.5° C.;
   pressure: from about 740 to 780 mTorr; and
   time; from about 80 to 100 seconds.

17. The method of claim 1, wherein the exposed portion of the oxide layer; and the portions of the oxide layer underneath the patterned nitride layer adjacent to the opening are removed by an oxide wet bench dip process at the following conditions:

HF: H$_2$O ratio: from about 95:1 to 105:1;

temperature: from about 20.5 to 26.5° C.;

pressure: from about 750 to 770 mTorr; and time; from about 85 to 95 seconds.

18. The method of claim 1, wherein the exposed portion of the oxide layer; and the portions of the oxide layer underneath the patterned nitride layer adjacent to the opening are removed by an oxide wet bench dip employing an HF:H$_2$O ratio of about 100:1.

19. The method of claim 1, wherein the opening within the patterned nitride layer has a width of from about 0.34 to 0.40 μm.

20. The method of claim 1, wherein the opening within the patterned nitride layer 14 has a width of from about 0.36 to 0.38 μm.

21. The method of claim 1, wherein the undercuts extend from about 30 to 70 Å underneath the patterned nitride layer.

22. The method of claim 1, wherein the undercuts extend from about 40 to 60 Å underneath the patterned nitride layer.

23. The method of claim 1, wherein the undercuts extend about 50 Å underneath the patterned nitride layer.

24. The method of claim 1, wherein the floating gate oxide layer has a mid-thickness of from about 3500 to 4500 Å.

25. The method of claim 1, wherein the floating gate oxide layer has a mid-thickness of from about 3800 to 4200 Å.

26. The method of claim 1, wherein the floating gate oxide layer has tip corners; each of the tip corners each having an average width of from about 250 to 350 Å.

27. The method of claim 1, wherein the floating gate oxide layer has tip corners; each of the tip corners each having an average width of from about 280 to 320 Å.

28. The method of claim 1, including the step of forming a flash memory incorporating the floating gate oxide layer.

29. A method for forming a floating gate oxide layer, comprising the steps of:

providing a structure having a lower gate oxide layer formed thereover;

forming a poly layer over the lower gate oxide layer;

forming an oxide layer over the poly layer;

forming a nitride layer over the oxide layer;

patterning the nitride layer to form an opening exposing a portion of the oxide layer;

exposing a portion of the poly layer by removing:
the exposed portion of the oxide layer; and
portions of the oxide layer underneath the patterned nitride layer adjacent to the opening to form respective undercuts; and oxidizing the exposed portion of the poly layer to form the floating gate oxide layer.

30. The method of claim 29, wherein the floating gate oxide layer includes respective tip corners.

31. The method of claim 29, including the step of forming a flash memory incorporating the floating gate oxide layer whereby the forward tunneling voltage of the flash memory is improved.

32. The method of claim 29, wherein the poly layer is polysilicon; and the nitride layer is silicon nitride.

33. The method of claim 29, wherein the structure is a silicon substrate or a germanium substrate.

34. The method of claim 29, wherein the structure is a silicon substrate.

35. The method of claim 29, wherein the oxide layer is a silicon oxide layer.

36. The method of claim 29, wherein the silicon oxide layer has a thickness of from about 26 to 34 Å; the poly layer has a thickness of from about 900 to 1100 Å; the oxide layer has a thickness of from about to 34 Å; and the nitride layer has a thickness of from about 720 to 880 Å.

37. The method of claim 29, wherein the silicon oxide layer has a thickness of from about 28 to 32 Å; the poly layer has a thickness of from about 950 to 1050 Å; the oxide layer has a thickness of from about 28 to 32 Å; and the nitride layer has a thickness of from about 760 to 840 Å.

38. The method of claim 29, wherein the silicon oxide layer has a thickness of about 30 Å; the poly layer has a thickness of about 1000 Å; the oxide layer has a thickness of about 30 Å; and the nitride layer has a thickness of about 800 Å.

39. The method of claim 29, wherein the nitride layer is patterned using a dry etch.

40. The method of claim 29, wherein the nitride layer is patterned using a dry etch process at the following conditions:

temperature: from about 15 to 25° C.;

pressure: from about 225 to 275 mTorr;

RF power: from about 1000 to 1400 W;

O$_2$ gas flow: from about 4 to 6 sccm;

CF$_4$ gas flow: from about 66 to 76 sccm;

Ar gas flow: from about 750 to 950 sccm; and time; from about 45 to 55 seconds.

41. The method of claim 29, wherein the nitride layer is patterned using a dry etch process at the following conditions:

temperature: from about 17 to 23° C.;

pressure: from about 245 to 255 mTorr;

RF power: from about 1080 to 1320 W;

O$_2$ gas flow: from about 4.5 to 5.5 sccm;

CF$_4$ gas flow: from about 68 to 74 sccm;

Ar gas flow: from about 800 to 900 sccm; and time; from about 48 to 52 seconds.

42. The method of claim 29, wherein the exposed portion of the oxide layer; and the portions of the oxide layer underneath the patterned nitride layer adjacent to the opening are removed by etching.

43. The method of claim 29, wherein the exposed portion of the oxide layer; and the portions of the oxide layer underneath the patterned nitride layer adjacent to the opening are removed by an oxide wet bench dip etching process.

44. The method of claim 29, wherein the exposed portion of the oxide layer; and the portions of the oxide layer underneath the patterned nitride layer adjacent to the opening are removed by an oxide wet bench dip process at the following conditions:

HF:H$_2$O ratio: from about 90:1 to 110:1;

temperature: from about 18.5 to 28.5° C.;

pressure: from about 740 to 780 mTorr; and time; from about 80 to 100 seconds.

45. The method of claim 29, wherein the exposed portion of the oxide layer; and the portions of the oxide layer underneath the patterned nitride layer adjacent to the opening are removed by an oxide wet bench dip process at the following conditions:

HF:H$_2$O ratio: from about 95:1 to 105:1;

temperature: from about 20.5 to 26.5° C.;

pressure: from about 750 to 770 mTorr; and time; from about 85 to 95 seconds.

46. The method of claim 29, wherein the exposed portion of the oxide layer; and the portions of the oxide layer underneath the patterned nitride layer adjacent to the opening are removed by an oxide wet bench dip employing an HF:$H_2O$ ratio of about 100:1.

47. The method of claim 29, wherein the opening within the patterned nitride layer has a width of from about 0.34 to 0.40 $\mu$m.

48. The method of claim 29, wherein the opening within the patterned nitride layer 14 has a width of from about 0.36 to 0.38 $\mu$m.

49. The method of claim 29, wherein the undercuts extend from about 30 to 70 Å underneath the patterned nitride layer.

50. The method of claim 29, wherein the undercuts extend from about 40 to 60 Å underneath the patterned nitride layer.

51. The method of claim 29, wherein the undercuts extend about 50 Å underneath the patterned nitride layer.

52. The method of claim 29, wherein the floating gate oxide layer has a mid-thickness of from about 3500 to 4500 Å.

53. The method of claim 29, wherein the floating gate oxide layer has a mid-thickness of from about 3800 to 4200 Å.

54. The method of claim 29, wherein the floating gate oxide layer has tip corners; each of the tip corners each having an average width of from about 250 to 350 Å.

55. The method of claim 29, wherein the floating gate oxide layer has tip corners; each of the tip corners each having an average width of from about 280 to 320 Å.

56. The method of claim 29, including the step of forming a flash memory incorporating the floating gate oxide layer.

57. The method of claim 1, including providing a lower gate oxide layer between the structure and the poly layer.

\* \* \* \* \*